(12) United States Patent
Obiraki et al.

(10) Patent No.: US 8,952,520 B2
(45) Date of Patent: Feb. 10, 2015

(54) POWER SEMICONDUCTOR DEVICE

(75) Inventors: Yoshiko Obiraki, Tokyo (JP); Seiji Oka, Tokyo (JP); Osamu Usui, Tokyo (JP); Yasushi Nakayama, Tokyo (JP); Takeshi Oi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 467 days.

(21) Appl. No.: 12/504,250

(22) Filed: Jul. 16, 2009

(65) Prior Publication Data

US 2010/0013086 A1 Jan. 21, 2010

(30) Foreign Application Priority Data

Jul. 18, 2008 (JP) .................................. 2008-186602

(51) Int. Cl.
*H01L 23/48* (2006.01)
*H01L 23/373* (2006.01)
(Continued)

(52) U.S. Cl.
CPC ........ *H01L 23/3735* (2013.01); *H01L 23/3121* (2013.01); *H01L 23/49811* (2013.01); *H01L 24/34* (2013.01); *H01L 24/49* (2013.01); *H01L 24/29* (2013.01); *H01L 24/45* (2013.01); *H01L 2224/32225* (2013.01); *H01L 2224/45124* (2013.01); *H01L 2224/48091* (2013.01); *H01L 2224/48227* (2013.01); *H01L 2224/48247* (2013.01); *H01L 2224/49* (2013.01); *H01L 2224/73265* (2013.01);
(Continued)

(58) Field of Classification Search
USPC .......... 257/697, 698, 693, 150, 177; 438/121, 438/122, 124, 126, 127
See application file for complete search history.

(56) References Cited

U.S. PATENT DOCUMENTS 4,862,247 A * 8/1989 Derryberry et al. .......... 257/693
7,816,781 B2 * 10/2010 Thoben et al. ................ 257/693
(Continued)

FOREIGN PATENT DOCUMENTS

DE 10 2006 051 454 9/2007
DE 10 2006 058 695 6/2008
(Continued)

OTHER PUBLICATIONS

U.S. Appl. No. 12/504,225, filed Jul. 16, 2009, Oi, et al.
(Continued)

*Primary Examiner* — Yu-Hsi D Sun
(74) *Attorney, Agent, or Firm* — Oblon, Spivak, McClelland, Maier & Neustadt, L.L.P.

(57) ABSTRACT

A power semiconductor device with improved productivity, reduced size and reduction of amounting area therefore is provided. In the provided power semiconductor device, an external terminal does not limit an increase in current. The power semiconductor device is sealed with transfer molding resin. In the power semiconductor device, a cylindrical external terminal communication section is arranged on a wiring pattern so as to be substantially perpendicular to the wiring pattern. An external terminal can be inserted and connected to the cylindrical external terminal communication section. The cylindrical external terminal communication section allows the inserted external terminal to be electrically connected to the wiring pattern. A taper is formed at, at least, one end of the cylindrical external terminal communication section, which one end is joined to the wiring pattern.

7 Claims, 10 Drawing Sheets

(51) Int. Cl.
*H01L 23/31* (2006.01)
*H01L 23/498* (2006.01)
*H01L 23/00* (2006.01)

(52) U.S. Cl.
CPC ............. *H01L 2924/01004* (2013.01); *H01L 2924/01012* (2013.01); *H01L 2924/01013* (2013.01); *H01L 2924/01014* (2013.01); *H01L 2924/01028* (2013.01); *H01L 2924/01029* (2013.01); *H01L 2924/01047* (2013.01); *H01L 2924/01078* (2013.01); *H01L 2924/01082* (2013.01); *H01L 2924/014* (2013.01); *H01L 2924/15312* (2013.01); *H01L 2924/1532* (2013.01); *H01L 2924/19107* (2013.01); *H01L 24/48* (2013.01); *H01L 2224/48137* (2013.01); *H01L 2924/01005* (2013.01); *H01L 2924/01006* (2013.01); *H01L 2924/01033* (2013.01); *H01L 2924/01068* (2013.01); *H01L 2924/1815* (2013.01)
USPC .......................................... 257/697; 257/693

(56) References Cited

U.S. PATENT DOCUMENTS

| | | | | |
|---|---|---|---|---|
| 2001/0030866 | A1* | 10/2001 | Hochstein | ..................... 362/294 |
| 2003/0025256 | A1* | 2/2003 | Roick | ......................... 267/142 |
| 2007/0215999 | A1 | 9/2007 | Kashimoto et al. | |
| 2009/0230526 | A1* | 9/2009 | Chen et al. | ..................... 257/676 |

FOREIGN PATENT DOCUMENTS

| | | |
|---|---|---|
| DE | 10 2008 008 141 | 8/2008 |
| DE | 11 2008 000 229 | 12/2009 |
| JP | 52-31374 | 3/1977 |
| JP | 53-122693 | 9/1978 |
| JP | 8-316357 | 11/1996 |
| JP | 2001-196495 | 7/2001 |
| JP | 2003-45920 | 2/2003 |
| JP | 2003-46058 | 2/2003 |
| JP | 2007-184315 | 7/2007 |
| JP | 2007-235004 | 9/2007 |

OTHER PUBLICATIONS

U.S. Appl. No. 12/523,948, filed Jul. 21, 2009, Oka, et al.
U.S. Appl. No. 12/535,222, filed Aug. 4, 2009, Oka, et al.
U.S. Appl. No. 12/540,880, filed Aug. 13, 2009, Obiraki, et al.
U.S. Appl. No. 12/577,376, filed Oct. 12, 2009, Obiraki, et al.
U.S. Appl. No. 12/582,025, filed Oct. 20, 2009, Oka, et al.
U.S. Appl. No. 13/086,499, filed Apr. 14, 2011, Oi, et al.
U.S. Appl. No. 13/150,593, filed Jun. 1, 2011, Oka, et al.
Office Action issued Aug. 29, 2011, in German Patent Application No. 10 2009 032 973.0 (with English translation).

* cited by examiner (A)　　　　　　(B)

POWER SEMICONDUCTOR DEVICE

BACKGROUND OF THE INVENTION

1. Field of the Invention

The present invention relates to a resin-sealed power semiconductor device, formed by transfer molding, which is excellent in terms of productivity. The present invention particularly relates to a resin-sealed power semiconductor device, formed by transfer molding, which is small in size and which realizes operation with a large current.

2. Description of the Background Art

A power semiconductor device, such as a power module, operates with a large current and high voltage. For this reason, it is essential to efficiently discharge heat, which is generated by the operation of the power semiconductor device, to the outside of the power semiconductor device.

One of such semiconductor devices is the one that is formed such that: power semiconductor elements are mounted on a substrate that includes a metal plate acting as a heat sink and a wiring pattern formed above the metal plate, the substrate including a ceramic plate interposed as an insulation layer between the wiring pattern and the metal plate; and heat-hardening resin is cast such that silicone gel is positioned between the heat-hardening resin and the substrate (see, e.g., Page 3, FIG. 1 of Japanese Laid-Open Patent Publication No. H08-316357 (hereinafter, referred to as Patent Document 1)).

However, in manufacturing of this conventional power semiconductor device, there are: a process of bonding the external casing, which is formed of thermoplastic resin, to the metal plate; a process of filling and curing the silicone gel; and a process of injecting and curing the heat-hardening resin. Thus, there are a large number of manufacturing processes, causing a prolonged manufacturing time. Accordingly, there is a problem of low productivity.

A power semiconductor device which solves this problem and which is excellent in terms of productivity is the one in which: a lead frame is provided on a metal plate while an insulation layer is interposed between the lead frame and the metal plate; and power semiconductor elements are mounted on the lead frame and sealed with transfer molding resin (see, e.g., Page 3, FIG. 1 of Japanese Laid-Open Patent Publication No. 2001-196495 (hereinafter, referred to as Patent Document 2)).

In the power semiconductor device sealed with transfer molding resin, the outer periphery of the lead frame has portions, each of which is, at one end thereof, connected to a power semiconductor element by a metal wire and each of which acts as an external terminal.

That is, the lead frame, which is provided on the metal plate while the insulation layer is interposed between the lead frame and the metal plate and which has the power semiconductor elements mounted thereon, is sealed with the transfer molding resin together with the power semiconductor elements. However, the other end of each of said portions of the outer periphery of the lead frame protrudes from the resin-sealed portion. The tie bar of the lead frame protruding from the resin-sealed portion is cut away, and each of said portions is used as a separate external terminal.

However, since the sealing with transfer molding resin is performed when the lead frame is sandwiched between upper and lower molds, a protruding direction of each external terminal is in parallel to a surface on which the power semiconductor elements are mounted. In other words, the power semiconductor device sealed with the transfer molding resin has a structure in which the external terminals protrude from peripheral side surfaces of the resin-sealed portion. A bending process is performed on the external terminals for mounting of the power semiconductor device.

In a power semiconductor device, there is a necessity to secure a sufficient spatial insulation distance between external terminals. The conventional power semiconductor device sealed with the transfer molding resin has a structure in which the external terminals protrude from peripheral side surfaces of the resin-sealed portion. If a sufficient insulation distance is to be secured between external terminals, then the power semiconductor device cannot be reduced in size. This causes a problem that a mounting area for the power semiconductor device cannot be reduced.

Moreover, since the bending process is performed on the lead frames that are used as the external terminals, there is a limitation regarding the thickness thereof. For this reason, the amount of current to be applied to the external terminals cannot be increased. Thus, there is a problem that an increase in the current is limited in the power semiconductor device.

SUMMARY OF THE INVENTION

The present invention has been made to solve the above problems. The object of the present invention is to provide a power semiconductor device, formed by sealing with transfer molding resin, with improved productivity, reduced size and reduction of the mounting area, and in which external terminals connected to an external circuit do not limit an increase in the current, and on which external terminals having various different shapes can be mounted.

A power semiconductor device according to the present invention comprises a circuit substrate including a metal heat sink and including a high thermal conductive insulation layer joined to one surface of the metal heat sink and including a wiring pattern provided on a surface of the high thermal conductive insulation layer, which surface is opposite to a surface, of the high thermal conductive insulation layer, joined to the metal heat sink, power semiconductor elements joined to element mounting portions of the wiring pattern, a cylindrical external terminal communication section joined to the wiring pattern, and circuit forming means for electrically connecting the power semiconductor elements, electrically connecting portions of the wiring pattern, and electrically connecting the power semiconductor elements and the wiring pattern. The circuit substrate, the power semiconductor elements, an outer side surface of the cylindrical external terminal communication section, and the circuit forming means, are all sealed with transfer molding resin. The cylindrical external terminal communication section is arranged on the wiring pattern so as to be substantially perpendicular to the wiring pattern. An external terminal is insertable and connectable to the cylindrical external terminal communication section. A taper is formed at, at least, one end of the cylindrical external terminal communication section, which one end is joined to the wiring pattern.

In the power semiconductor device according to the present invention, a cylindrical external terminal communication section is arranged on a wiring pattern so as to be substantially perpendicular to the wiring pattern, an external terminal can be inserted and connected to the cylindrical external terminal communication section, and a taper is formed at, at least, one end of the cylindrical external terminal communication section, which one end is joined to the wiring pattern. Accordingly, a space on an external circuit substrate or the like, which is required to mount the power semiconductor device, can be reduced. Further, adjacent power semiconductor devices in close proximity to each other can be mounted on an external circuit substrate or the like, whereby mounting density can be increased. Still further, a rod-like metal can be used as an external terminal, and a cross-sectional size of a surface of the external terminal, which surface is perpendicular to a direction in which a current is applied to the external terminal, can be increased. Therefore, a large current can be applied to the external terminal. Thus, the power semiconductor device that is small in size and capable of operating with a large current can be realized. Moreover, solder is firmly bonded to the cylindrical external terminal communication section, which is favorable. Accordingly, defective joining of the cylindrical external terminal communication section to the wiring pattern can be prevented. This increases manufacturing yield of the power semiconductor device, and thus productivity is improved.

The forgoing and other objects, features, aspects and advantages of the present invention will become more apparent from the following detailed description when read in conjunction with the accompanying drawings.

DETAILED DESCRIPTION OF THE PREFERRED EMBODIMENTS OF THE INVENTION

First Embodiment

Figure 1:
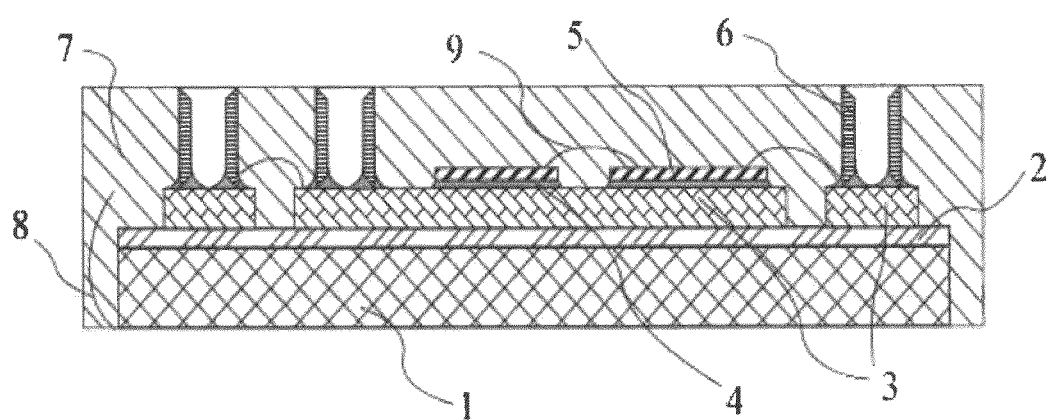
FIG. 1 is a schematic cross-sectional view showing a power semiconductor device according to the first embodiment of the present invention.

FIG. 1 is a schematic cross-sectional view showing a power semiconductor device according to the first embodiment of the present invention.

As shown in FIG. 1, in a power semiconductor device 100 of the present embodiment, a resin insulation layer 2 that is a high thermal conductive insulation layer is provided on one surface of a metal plate 1 that acts as a metal heat sink for dissipating heat of the power semiconductor device 100. A surface of the resin insulation layer 2 has a metallic foil wiring pattern 3 provided thereon, which surface is opposite to a surface, of the resin insulation layer 2, joined to the metal plate 1.

That is, the metal plate 1, the resin insulation layer 2 and the wiring pattern 3 constitute a metal circuit substrate 8. Power semiconductor elements 5 and cylindrical external terminal communication sections 6 are joined, by solder 4, to the wiring pattern 3. In particular, the cylindrical external terminal communication sections 6 are provided on the wiring pattern 3 so as to be substantially perpendicular to the wiring pattern 3. Electrical connection is formed between portions of the wiring pattern 3, between the power semiconductor elements 5, and between the wiring pattern 3 and the power semiconductor elements 5, via wire bonding 9 that is circuit forming means for forming such electrical connections.

A surface of the metal circuit substrate 8, on which the wiring pattern 3 is formed; peripheral side surfaces of the metal circuit substrate 8; the power semiconductor elements 5; the wire bonding 9; and outer side surfaces of the cylindrical external terminal communication sections 6, are sealed with transfer molding resin 7. However, a surface of the metal plate 1, which is opposite to its surface having the resin insulation layer 2 provided thereon, is not sealed with the transfer molding resin 7. Also, holes of the cylindrical external terminal communication sections 6 are not filled with the transfer molding resin 7.

Figure 2:
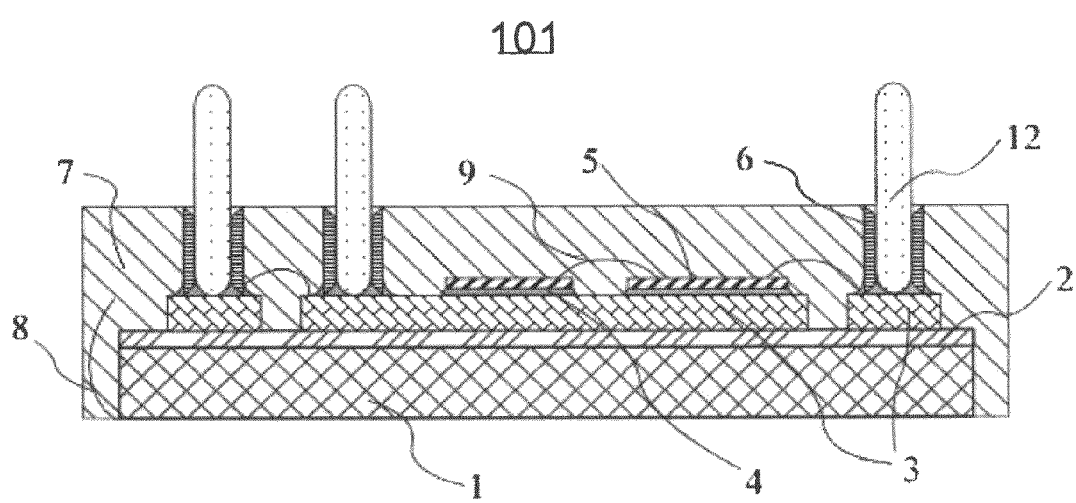
FIG. 2 is a schematic cross-sectional view showing that external terminals are inserted into cylindrical external terminal communication sections of the power semiconductor device according to the first embodiment of the present invention.

FIG. 2 is a schematic cross-sectional view showing that external terminals are inserted into the cylindrical external terminal communication sections of the power semiconductor device according to the first embodiment of the present invention.

As shown in FIG. 2, a power semiconductor device 101 is a result of inserting rod-like external terminals 12 into the cylindrical external terminal communication sections 6 of the power semiconductor device 100. However, the external terminals 12 to be inserted are not limited to rod-like terminals. The external terminals 12 may have a different shape from the rod-like shape as long as conduction between the power semiconductor device and an external circuit can be realized.

Figure 3:
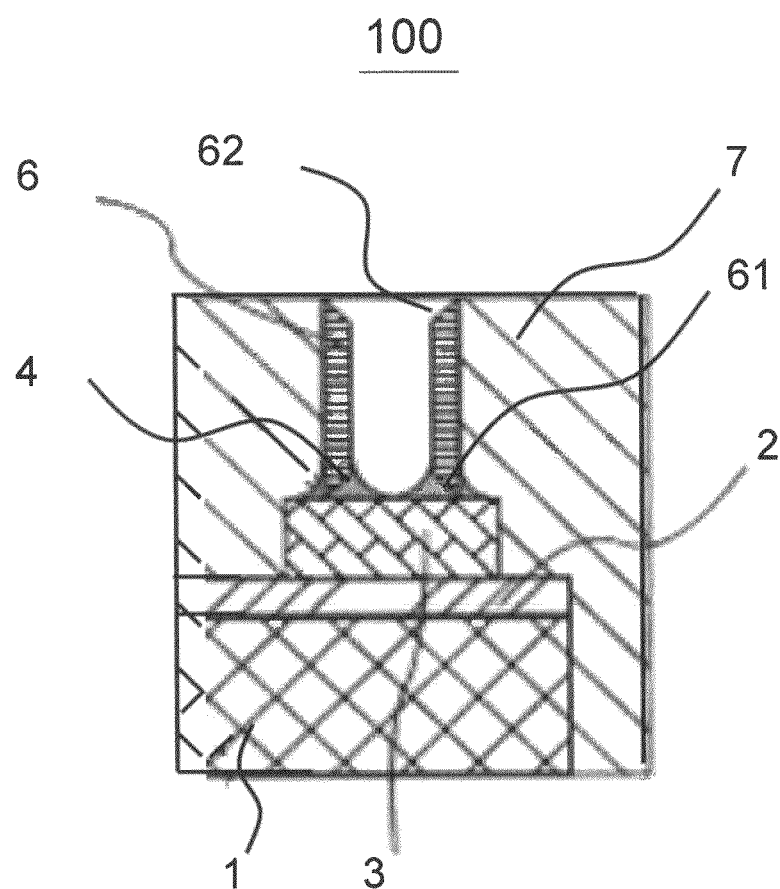
FIG. 3 is a schematic cross-sectional view of an area encompassing a cylindrical external terminal communication section provided in the power semiconductor device according to the first embodiment of the present invention.

FIG. 3 is a schematic cross-sectional view of an area encompassing a cylindrical external terminal communication section provided in the power semiconductor device according to the first embodiment of the present invention.

As shown in FIG. 3, a taper 61 is formed at one end, joined to the wiring pattern 3, of the cylindrical external terminal communication section 6 used in the power semiconductor device 100 of the present embodiment. The taper 61 has a shape such that the shorter the distance to a joint between the cylindrical external terminal communication section 6 and the wiring pattern 3, the greater is the inner diameter of the taper 61.

Although not shown, the taper at the one end may have an alternative shape such that the shorter the distance to the joint between the cylindrical external terminal communication section 6 and the wiring pattern 3, the smaller is the outer diameter of the taper 61. The angle of the taper is properly determined according to the type of solder to be used.

Also, a taper 62 is formed at the other end of the cylindrical external terminal communication section 6 of the present embodiment, which is shown in FIG. 3, such that the longer the distance from the joint between the cylindrical external terminal communication section 6 and the wiring pattern 3, the greater is the inner diameter of the taper 62. Although it is not necessary to form the taper 62, by forming such taper 62 for each cylindrical external terminal communication section 6, the external terminals 12 can be readily inserted into the cylindrical external terminal communication sections 6. Accordingly, the productivity of the power semiconductor device is improved.

Since the taper is formed at one end, joined to the wiring pattern 3, of each cylindrical external terminal communication section 6 used in the power semiconductor device 100 of the present embodiment, the solder 4 is firmly bonded to each cylindrical external terminal communication section 6, which is favorable. This prevents defective joining of the cylindrical external terminal communication sections 6 to the wiring pattern 3. Consequently, manufacturing yield of the power semiconductor device is increased, and thus productivity is improved. Also, reliability of the power semiconductor device during its use is improved.

The thickness of the cylindrical external terminal communication sections 6 is set so that the cylindrical external terminal communication sections 6 may not be crushed due to the molding pressure of the transfer molding. The thickness is properly determined based on the current carrying capacity of the power semiconductor device 100. The height of the cylindrical external terminal communication sections 6 is set to such a height as to allow the external terminals, which are later inserted and connected, to be connected sufficiently.

The inner diameters of the cylindrical external terminal communication sections 6 are determined in accordance with outer diameters of inserted portions of the external terminals 12 that are later inserted and connected to the cylindrical external terminal communication sections 6. The inner diameters of the cylindrical external terminal communication sections 6 are determined so as to allow, at least, the external terminals 12 to be attached to the cylindrical external terminal communication sections 6. The inner diameter of an end portion, at the transfer molding resin surface side, of each cylindrical external terminal communication section 6 may be set to be equal to, or greater than, the inner diameter of the central portion of said each cylindrical external terminal communication section 6. In this manner, the external terminals 12 can be readily inserted into the cylindrical external terminal communication sections 6.

Since the cylindrical external terminal communication sections 6 each have a through hole, when an external terminal 12 is inserted into a cylindrical external terminal communication section 6, the external terminal 12 contacts the wiring pattern 3 to which the cylindrical external terminal communication section 6 is joined. As a result, the external terminal 12 is electrically connected to the wiring pattern 3.

In the present embodiment, a metal having excellent thermal conductivity, for example, aluminum, aluminum alloy, copper, copper alloy, steel, steel alloy, or the like may be used for the metal plate 1. Alternatively, a composite material such as a composite of copper/steel-nickel alloy/copper, a composite of aluminum/steel-nickel alloy/aluminum, or the like may be used for the metal plate 1. In particular, in the case of using the metal plate 1 for the power semiconductor device 100 having a high current capacity, it is preferred to use copper having excellent thermal conductivity.

The thickness, length and width of the metal plate 1 are properly determined based on the current carrying capacity of the power semiconductor device 100. That is, the thickness, length and width of the metal plate 1 are increased in accordance with an increase in the current carrying capacity of the power semiconductor device 100.

In the present embodiment, used as the resin insulation layer 2 may be, for example, a resin insulation sheet containing various ceramics and inorganic powder, or a resin insulation sheet containing glass fiber. The inorganic powder contained in the resin insulation layer 2 is, for example, alumina, beryllia, boron nitride, magnesia, silica, silicon nitride, or aluminum nitride. The thickness of the resin insulation layer 2 is, for example, 20 to 400 μm.

Further, in the present embodiment, for example, a copper foil is used for the wiring pattern 3, and aluminum wires are used for the wire bonding 9. The thickness of the copper foil used for the wiring pattern 3, and the diameter and the number of aluminum wires used for the wire bonding 9, are also properly determined based on the current carrying capacity of the power semiconductor device 100.

Still further, in the present embodiment, metal cylinders are used for the cylindrical external terminal communication sections 6, for example. The material used for the metal cylinders is preferably a metal plated with, for example, copper, copper alloy, aluminum, or aluminum alloy, which has excellent thermal conductivity and electrical conductivity and which can be joined to the wiring pattern 3 by the solder 4.

In the present embodiment, for example, epoxy resin filled with silica powder filler is used as the transfer molding resin 7. In the transfer molding resin 7, the content percentage of the filled silica powder is determined to be an optimal amount in consideration of a thermal expansion coefficient or the like of each component used in the power semiconductor device 100.

For example, when copper is used for the wiring pattern 3 and the metal plate 1, the amount of silica powder filling the epoxy resin is set such that the thermal expansion coefficient of the transfer molding resin 7 coincides with the thermal expansion coefficient of the copper, that is, 16 ppm/° C. In this manner, a power semiconductor device, in which a warp does not occur, can be obtained.

In order to improve heat dissipation of the transfer molding resin 7, it is preferred to use alumina powder as the filler, instead of silica powder.

In the present embodiment, a metal having excellent thermal conductivity and electrical conductivity is used for the external terminals 12 to be inserted into the cylindrical external terminal communication sections 6. In particular, a copper material is preferred. Cross-sectional sizes of the external terminals 12 are properly determined based on the current carrying capacity of the power semiconductor device 100.

Described next is an example of a manufacturing method of the power semiconductor device according to the present embodiment.

In manufacturing of the power semiconductor device 100 of the present embodiment, for example, an epoxy resin sheet containing B-stage alumina powder is placed on a 3 mm-thick aluminum plate, and a 0.3 mm-thick copper foil is superimposed thereon. Then, the layer of: the aluminum plate; the epoxy resin sheet containing the alumina powder; and the copper foil, is heated and pressurized so as to join the aluminum plate and the copper foil via the epoxy resin sheet containing the alumina powder. Next, the wiring pattern 3 is formed by performing etching on the copper foil. In this manner, the metal circuit substrate 8 is formed, which includes: the aluminum metal plate 1; the resin insulation layer 2 formed of epoxy resin containing alumina powder; and the copper wiring pattern 3.

Thereafter, although not shown, solder resist is formed at predetermined positions. This process is, however, not necessary.

Next, by using the solder 4, the power semiconductor elements 5 are joined to element mounting portions provided at predetermined positions on the wiring pattern 3, and the cylindrical external terminal communication sections 6 are joined to joining areas that are provided, for the cylindrical external terminal communication sections 6, at predetermined positions on the wiring pattern 3.

Then, between portions of the wiring pattern 3, between the power semiconductor elements 5, and between the wiring pattern 3 and the power semiconductor elements 5, positions that require conduction therebetween are connected via the aluminum wire bonding 9.

In the present embodiment, positions that require conduction therebetween are connected via the wire bonding 9. However, these positions may not necessarily be connected via the wire bonding. Other means capable of electrically connecting these positions may be used instead.

Next, the metal circuit substrate 8, on which the wire-bonded power semiconductor elements 5 and the cylindrical external terminal communication sections 6 are mounted, is set into a mold and then sealed by a transfer molding method with the transfer molding resin 7 that is of, for example, an epoxy resin type filled with silica powder. In this manner, the power semiconductor device 100 is completed.

The holes of the cylindrical external terminal communication sections 6 of the power semiconductor device 100 according to the present embodiment are where the external terminals 12, which establish conduction between the power semiconductor device 100 and an external circuit, are connected.

The method for connecting the cylindrical external terminal communication sections 6 and the external terminals 12 is soldering, press-in connection that is typically press fitting for metal-to-metal joint, thread connection, or the like. Preferred here is press-in connection, typically press fitting, which is low-cost and which has high reliability at joints and processes of which are simple.

In manufacturing of the power semiconductor device 100 of the present embodiment, the wire bonding is performed between predetermined components after all the components such as the power semiconductor elements 5 and the cylindrical external terminal communication sections 6 are joined to the wiring pattern 3 of the metal circuit substrate 8 by soldering. However, the wire bonding may be performed between predetermined components after all the power semiconductor elements 5 are joined to the wiring pattern 3 of the metal circuit substrate 8. Then, the cylindrical external terminal communication sections 6 may be joined to the wiring pattern 3 after the wire bonding is performed.

In the above manner, restrictions for a wire bonding equipment at the time of performing the wire bonding are eliminated. As a result, even when the cylindrical external terminal communication sections 6 having a considerable height are used, the wire bonding can be performed near the cylindrical external terminal communication sections 6. Thus, an increase in dimensions of an area on which the components of the power semiconductor device are mounted, can be prevented even when the cylindrical external terminal communication sections 6 having a considerable height are used.

In this manufacturing method, since the cylindrical external terminal communication sections 6 are joined to the wiring pattern 3 on which the power semiconductor elements 5 have previously been joined, the cylindrical external terminal communication sections 6 are joined by using low-melting solder, or in a different manner from soldering. Instead of soldering, the cylindrical external terminal communication sections 6 may be joined to the wiring pattern 3 by means of, for example, silver paste bonding or ultrasonic bonding.

In the present embodiment, the external terminals 12 can be connected to the power semiconductor device 100 such that the external terminals 12 are substantially perpendicular to the wiring pattern surface of the metal circuit substrate 8, and such that the external terminals 12 protrude from the transfer molding resin 7. That is, the power semiconductor device 100 does not have a configuration in which the external terminals 12 protrude from the peripheral side surfaces of the transfer molding resin 7 of the power semiconductor device 100. Thus, the external terminals 12 can be provided within a projection area of a mounting surface for the power semiconductor device.

Accordingly, in the present embodiment, a space on an external circuit substrate or the like, which is required to mount the power semiconductor device, can be reduced. Further, since the power semiconductor device does not have a configuration in which the external terminals protrude from the peripheral side surfaces of the transfer molding resin of the power semiconductor device, adjacent power semiconductor devices in close proximity to each other can be mounted on an external circuit substrate or the like, whereby mounting density on an apparatus can be increased.

Since, in the power semiconductor device 100 of the present embodiment, the external terminals 12 are inserted and connected to the cylindrical external terminal communication sections 6, the external terminals 12 used herein may each have a cross-sectional size that accords with the power, i.e., the current carrying capacity, of the power semiconductor device 100. In other words, cross-sectional sizes of surfaces of the external terminals, which surfaces are perpendicular to a direction in which a current is applied to the external terminals, can be increased as compared to a case where a lead frame is used as the external terminals. As a result, a larger current can be applied to the external terminals. Therefore, a power semiconductor device, which is small in size and capable of operating with such a larger current, can be realized.

Further, in the power semiconductor device 100 of the present embodiment, the taper 61 is formed at one end, joined to the wiring pattern 3, of each cylindrical external terminal communication section 6. Consequently, the solder 4 is firmly bonded to each cylindrical external terminal communication section 6, which is favorable. This prevents defective joining of the cylindrical external terminal communication sections 6 to the wiring pattern 3. As a result, manufacturing yield of the power semiconductor device is increased, and thus productivity is improved.

Still further, although the metal circuit substrate is used as a circuit substrate of the power semiconductor device 100 of the present embodiment, a ceramic substrate may be used instead. For example, the ceramic substrate includes: a ceramic plate that is a high thermal conductive insulation layer; a copper wiring pattern provided on one surface of the ceramic plate; and a copper metal heat sink provided on the other surface of the ceramic plate.

Second Embodiment

Figure 4:
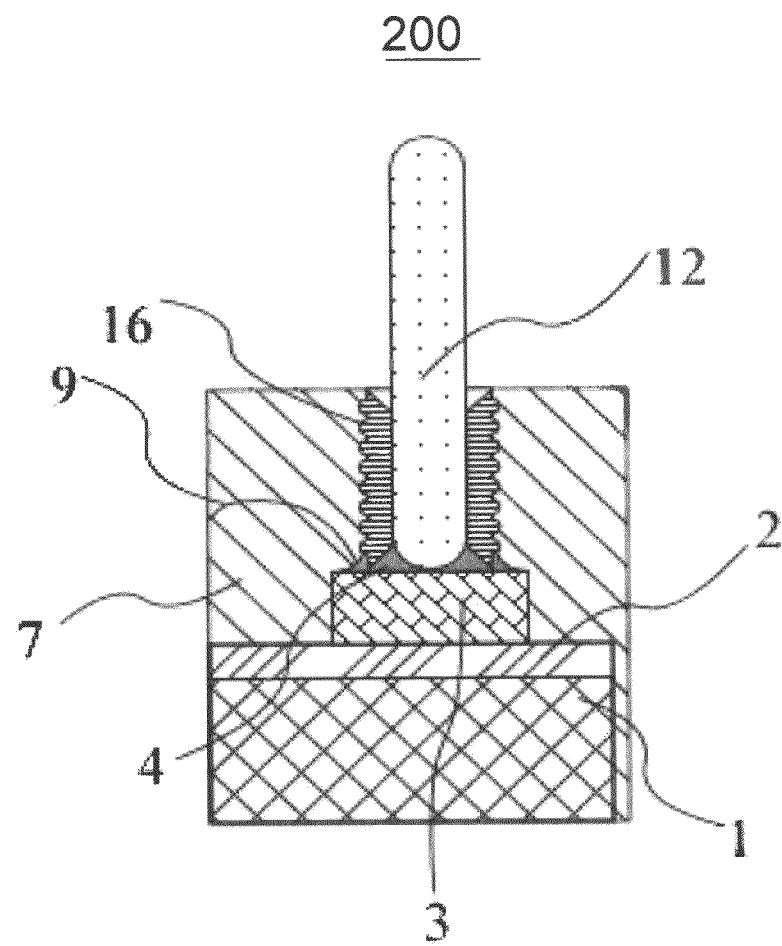
FIG. 4 is a schematic cross-sectional view of an area encompassing a cylindrical external terminal communication section provided in a power semiconductor device according to the second embodiment of the present invention.

FIG. 4 is a schematic cross-sectional view of an area encompassing a cylindrical external terminal communication section provided in a power semiconductor device according to the second embodiment of the present invention.

FIG. 4 shows that an external terminal is inserted into the cylindrical external terminal communication section of the power semiconductor device.

As shown in FIG. 4, a power semiconductor device 200 of the present embodiment is the same as the first embodiment except that cylindrical external terminal communication sections 16 each having projections and depressions on the outer side surface thereof, are used. The height, from the bottom of the depressions of each cylindrical external terminal communication section 16, of the top of the projections is preferred to be 10 to 100 µm.

The power semiconductor device 200 of the present embodiment provides the same effects as those of the power semiconductor device 100 of the first embodiment. In addition, since the outer side surface of each cylindrical external terminal communication section 16 is provided with the projections and depressions, the transfer molding resin 7 and the cylindrical external terminal communication sections 16 are more firmly joined when the transfer molding is performed. This improves long-term reliability of the power semiconductor device.

Third Embodiment

Figure 5:
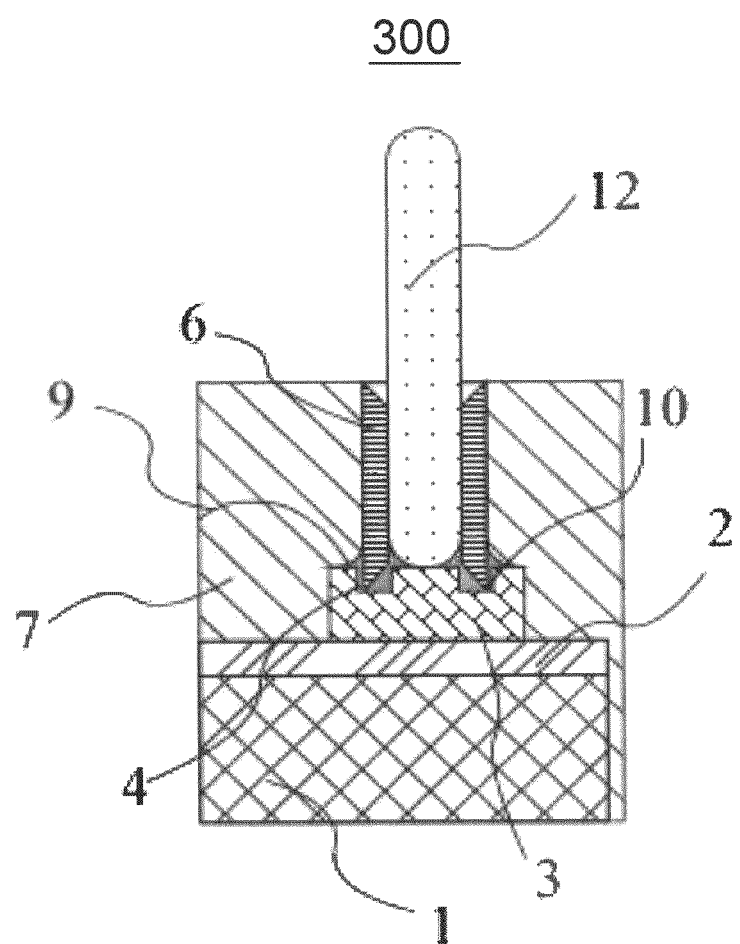
FIG. 5 is a schematic cross-sectional view of an area encompassing a cylindrical external terminal communication section provided in a power semiconductor device according to the third embodiment of the present invention.

FIG. 5 is a schematic cross-sectional view of an area encompassing a cylindrical external terminal communication section provided in a power semiconductor device according to the third embodiment of the present invention.

FIG. 5 shows that an external terminal is inserted into the cylindrical external terminal communication section of the power semiconductor device.

As shown in FIG. 5, a power semiconductor device 300 of the present embodiment is the same as the first embodiment except that portions of the wiring pattern 3, to which portions the cylindrical external terminal communication sections 6 are joined, are each provided with a groove 10 for mounting a cylindrical external terminal communication section thereon.

The power semiconductor device 300 of the present embodiment provides the same effects as those of the power semiconductor device 100 of the first embodiment. In addition, since the wiring pattern 3 is provided with the grooves 10 for mounting the cylindrical external terminal communication sections thereon, the cylindrical external terminal communication sections 6 can be properly positioned on the wiring pattern 3, and the cylindrical external terminal communication sections 6 can be precisely joined, by soldering, to cylindrical-external-terminal-communication-section mounting positions on the wiring pattern 3. This also improves reliability at the solder joints.

That is, the rate of defective joining of the cylindrical external terminal communication sections 6 to the wiring pattern 3 is further reduced. This further increases the manufacturing yield of the power semiconductor device. Thus, productivity is further improved.

Fourth Embodiment

Figure 6:
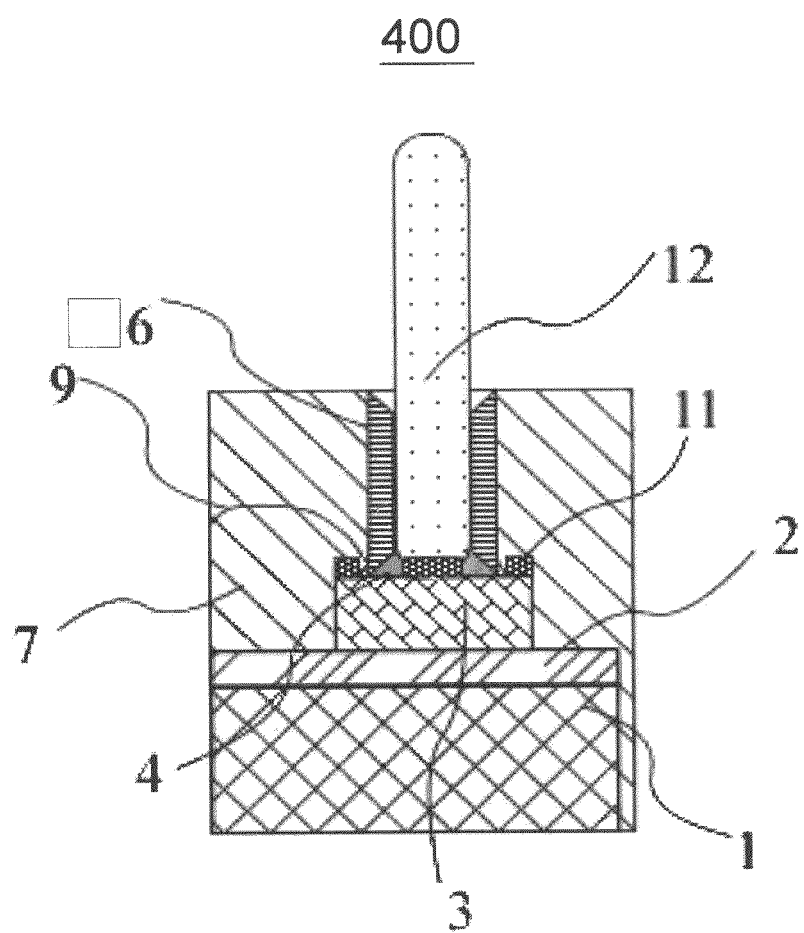
FIG. 6 is a schematic cross-sectional view of an area encompassing a cylindrical external terminal communication section provided in a power semiconductor device according to the fourth embodiment of the present invention.

FIG. 6 is a schematic cross-sectional view of an area encompassing a cylindrical external terminal communication section provided in a power semiconductor device according to the fourth embodiment of the present invention.

FIG. 6 shows that an external terminal is inserted into the cylindrical external terminal communication section of the power semiconductor device.

As shown in FIG. 6, a power semiconductor device 400 of the present embodiment is the same as the first embodiment except that portions of the wiring pattern 3, to which portions the cylindrical external terminal communication sections 6 are mounted, are each provided with circular solder resist 11 whose diameter is smaller than the inner diameter of a corresponding cylindrical external terminal communication section 6.

The power semiconductor device 400 of the present embodiment provides the same effects as those of the power semiconductor device 100 of the first embodiment. In addition, since the power semiconductor device 400 is provided with the solder resist 11 as descried above, the cylindrical external terminal communication sections 6 can be precisely joined, by soldering, to cylindrical-external-terminal-communication-section mounting positions on the wiring pattern 3. This reduces defects caused by displacement in the joining of the cylindrical external terminal communication sections 6 to the wiring pattern 3. As a result, manufacturing yield of the power semiconductor device is further increased. Thus, productivity is further improved.

Fifth Embodiment

Figure 7:
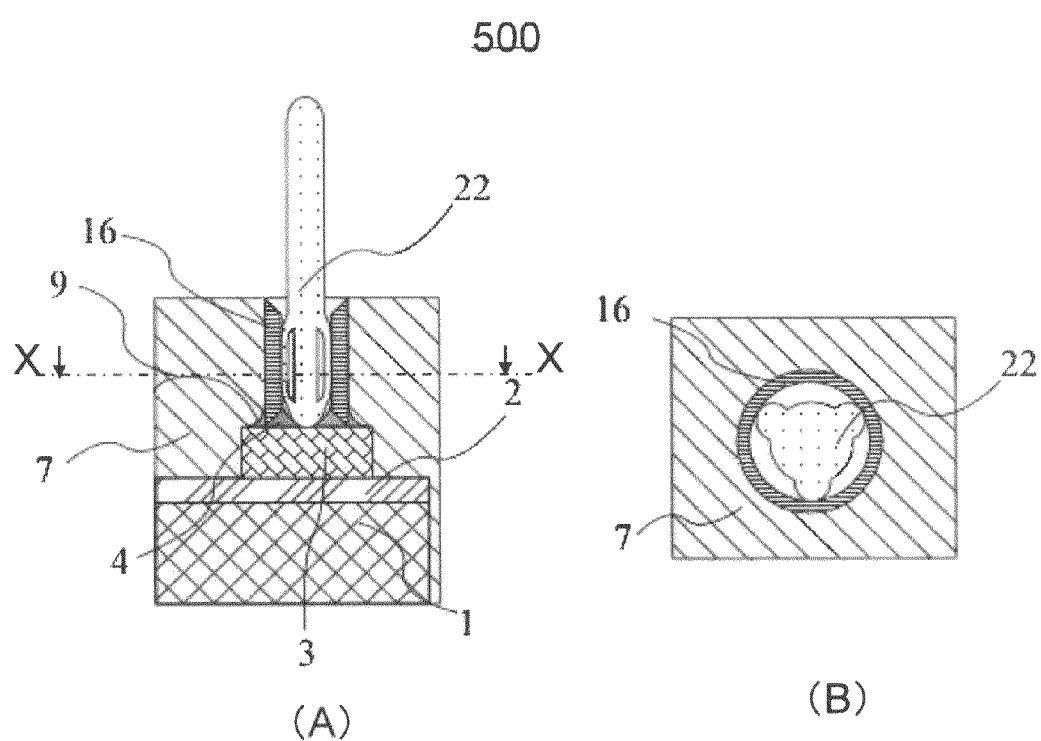
FIG. 7A is a schematic cross-sectional view of an area encompassing a cylindrical external terminal communication section provided in a power semiconductor device according to the fifth embodiment of the present invention.
FIG. 7B is a schematic cross-sectional view that is cut along a line X-X indicated in the schematic cross-sectional view of FIG. 7A

FIG. 7A is a schematic cross-sectional view of an area encompassing a cylindrical external terminal communication section provided in a power semiconductor device according to the fifth embodiment of the present invention. FIG. 7B is a schematic cross-sectional view that is cut along a line X-X indicated in the schematic cross-sectional view of FIG. 7A.

As shown in FIGS. 7A and 7B, a power semiconductor device 500 of the present embodiment is the same as the first embodiment except that in the present embodiment, rod-like external terminals 22, each of which has three projections contacting the inner wall of a corresponding cylindrical external terminal communication section 6, are inserted into the cylindrical external terminal communication sections 6 of the power semiconductor device 100 of the first embodiment.

Figure 8:
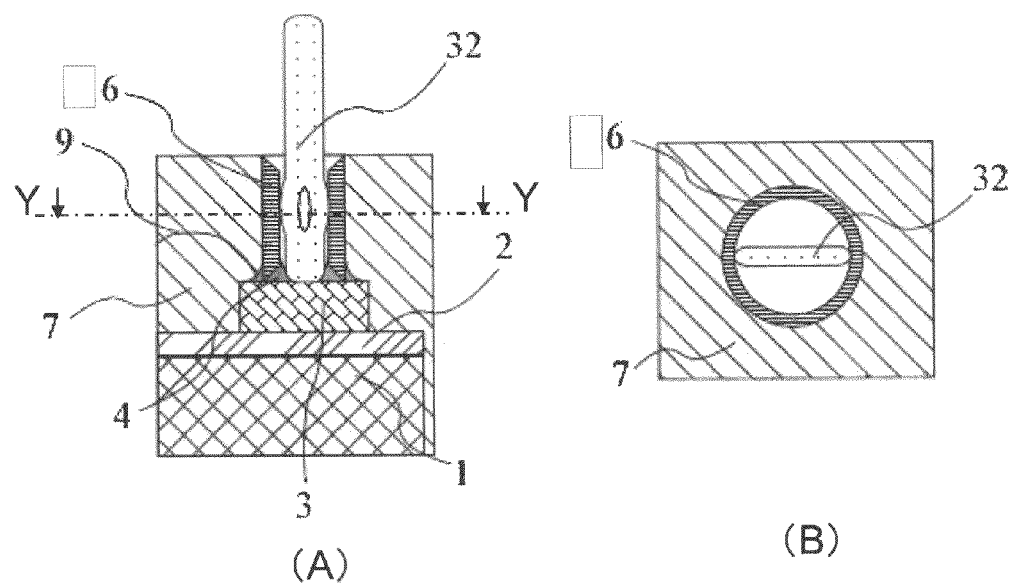
FIG. 8A is a schematic cross-sectional view of an area encompassing a cylindrical external terminal communication section of the power semiconductor device of the first embodiment, the cross-sectional view showing that a compliant pin as an external terminal is inserted into the cylindrical external terminal communication section.
FIG. 8B is a schematic cross-sectional view that is cut along a line Y-Y indicated in the schematic cross-sectional view of FIG. 8A.

FIG. 8A is a schematic cross-sectional view of an area encompassing a cylindrical external terminal communication section of the power semiconductor device of the first embodiment, the cross-sectional view showing that a compliant pin as an external terminal is inserted into the cylindrical external terminal communication section. FIG. 8B is a schematic cross-sectional view that is cut along a line Y-Y indicated in the schematic cross-sectional view of FIG. 8A.

A power semiconductor device 501 as shown in FIGS. 8A and 8B is a result of inserting, as external terminals 32, compliant pins, which are used for press-fit joining, into the cylindrical external terminal communication sections 6 of the power semiconductor device 100 of the first embodiment. Here, since each compliant pin is a plate-shaped conductor, each compliant pin contacts, at two points, a corresponding cylindrical external terminal communication section 6.

Whereas, in the power semiconductor device 500 of the present embodiment as shown in FIGS. 7A and 7B, each external terminal 22 contacts, at three points, a corresponding cylindrical external terminal communication section 6. Therefore, as compared to the case where the external terminals 32 that are compliant pins are used, contact areas between the external terminals and the cylindrical external terminal communication sections are increased. For this reason, the power semiconductor device 500 can operate with a larger current and higher voltage.

In the power semiconductor device 500 of the present embodiment, all the external terminals each contact the corresponding cylindrical external terminal communication section 6 at three points. However, the present embodiment is not limited thereto. For example, external terminals 22 each contacting a corresponding cylindrical external terminal communication section 6 at three points may be used for main electrodes, and external terminals 32 that are compliant pins may be used for control terminals to which a small current and low voltage are applied.

In the present embodiment, the rod-like external terminals 22, each of which has three projections contacting the corresponding cylindrical external terminal communication section 6, are used. However, the number of projections of each external terminal, which contact the corresponding cylindrical external terminal communication section 6, may be more than three if such number of projections are formable. In other words, for each external terminal, the optimal number of projections contacting the corresponding cylindrical external terminal communication section 6 is determined based on the inner diameter of the corresponding cylindrical external terminal communication section 6.

Sixth Embodiment

Figure 9:
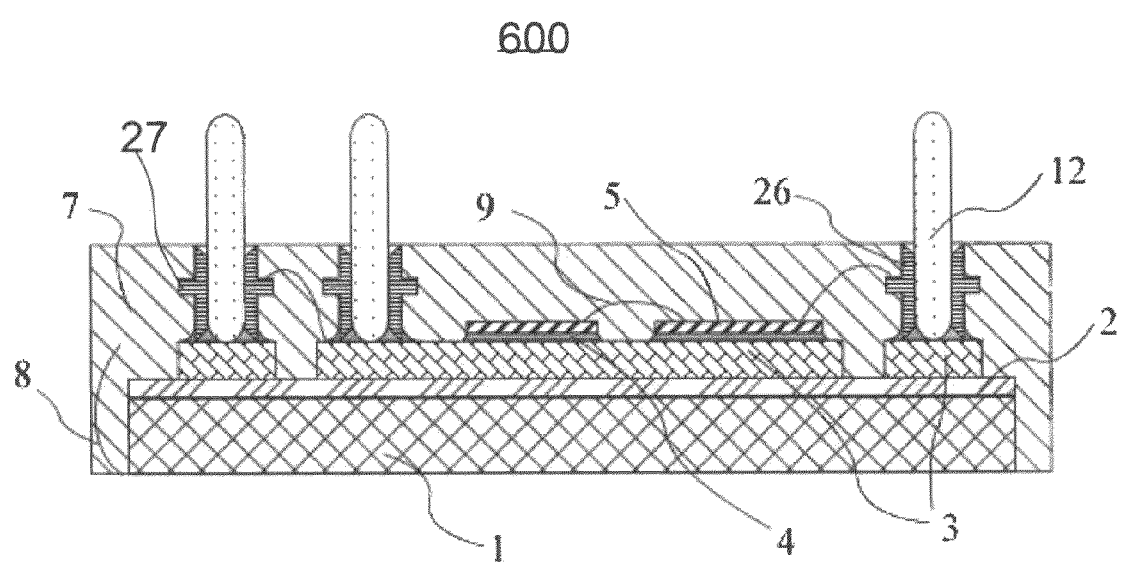
FIG. 9 is a schematic cross-sectional view of a power semiconductor device according to the sixth embodiment of the present invention.

FIG. 9 is a schematic cross-sectional view of a power semiconductor device according to the sixth embodiment of the present invention.

FIG. 9 shows that external terminals are inserted into cylindrical external terminal communication sections of the power semiconductor device.

As shown in FIG. 9, in a power semiconductor device 600 of the present embodiment, pad-fitted cylindrical external terminal communication sections 26 are used, each of which has, in the middle of the outer side surface thereof, a pad 27 on which wire bonding can be performed. The present embodiment is the same as the first embodiment except that the wire bonding 9 is connected to the pads 27 of the pad-fitted cylindrical external terminal communication sections 26, instead of connecting bonding wires to portions, conductive with the cylindrical external terminal communication sections, of the wiring pattern 3.

In the power semiconductor device 600 of the present embodiment, even in the case where mounting density of the components is high and due to the restrictions caused thereby, a wire bonding equipment cannot attach bonding wires to the wiring pattern near the cylindrical external terminal communication sections, the wire bonding between predetermined portions and the cylindrical external terminal communication sections can still be performed since the pad-fitted cylindrical external terminal communication sections 26 each have, in the middle of the outer side surface thereof, the pad 27 on which the wire bonding can be performed.

In other words, the pad-fitted cylindrical external terminal communication sections 26 can be arranged with small intervals therebetween. Accordingly, the size of the wiring pattern 3 can be reduced, and high-density mounting of the components is possible. Consequently, the power semiconductor device can be further reduced in size.

The power semiconductor device 600 of the present embodiment is excellent in terms of productivity since all the components can be mounted by a single soldering process.

Seventh Embodiment

Figure 10:
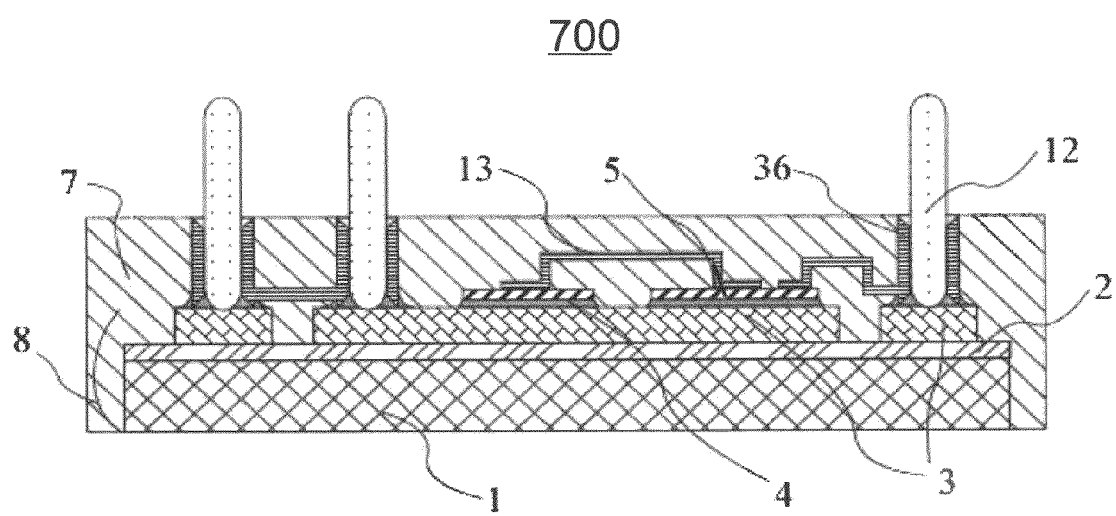
FIG. 10 is a schematic cross-sectional view of a power semiconductor device according to the seventh embodiment of the present invention.

FIG. 10 is a schematic cross-sectional view of a power semiconductor device according to the seventh embodiment of the present invention.

FIG. 10 shows that external terminals are inserted into cylindrical external terminal communication sections of the power semiconductor device.

As shown in FIG. 10, a power semiconductor device 700 of the present embodiment is the same as the first embodiment except that in the present embodiment, wire bonding connection is not used, and bus-bar-terminal-fitted cylindrical external terminal communication sections 36 and direct-lead bus bars 13 for connecting other mounted components are used.

In the power semiconductor device 700 of the present embodiment, since the wire bonding is not used, the wire bonding process can be eliminated. Moreover, the power semiconductor device 700 is excellent in terms of productivity since, during a single soldering process, the bus-bar-terminal-fitted cylindrical external terminal communication sections 36 are joined to the wiring pattern 3; the power semiconductor elements 5 are joined to the wiring pattern 3; and the direct-lead bus bars 13 are joined to the power semiconductor elements 5.

Furthermore, a power semiconductor device that accommodates a large current can be realized by changing the width and thickness of each bus bar, without performing multiple wire bonding in parallel. This also contributes to excellent productivity.

The power semiconductor device according to the present invention can be effectively utilized in small-sized electric appliances that require a large current.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor device, comprising:
    a circuit substrate including a metal heat sink and including a thermal conductive insulation layer joined to one surface of the metal heat sink and including a wiring pattern provided on a surface of the thermal conductive insulation layer, which surface is opposite to a surface, of the thermal conductive insulation layer, joined to the metal heat sink;
    power semiconductor elements joined to element mounting portions of the wiring pattern;
    a cylindrical external terminal communication section having a through hole, the cylindrical external terminal communication section including a taper formed at an inner side of the cylindrical external terminal communication section at an end of the cylindrical external terminal communication section directly joined to the wiring pattern; and
    circuit forming means for electrically connecting the power semiconductor elements, electrically connecting portions of the wiring pattern, and electrically connecting the power semiconductor elements and the wiring pattern, wherein
    the circuit substrate, the power semiconductor elements, an outer side surface of the cylindrical external terminal communication section, and the circuit forming means, are sealed with a transfer molding resin,
    the cylindrical external terminal communication section is arranged on the wiring pattern to be substantially perpendicular to the wiring pattern,
    the taper has a shape such that, the shorter the distance to a joint between the cylindrical external terminal communication section and the wiring pattern, the greater is the inner diameter of the taper, a joiner is interposed between the taper and the wiring pattern, and a mechanism for properly positioning the cylindrical external terminal communication section on the wiring pattern, the mechanism including at least one groove formed in the wiring pattern.

2. The power semiconductor device according to claim 1, wherein the outer side surface of the cylindrical external terminal communication section is provided with projections and depressions.

3. The power semiconductor device according to claim 1, wherein a portion of the wiring pattern, to which portion the cylindrical external terminal communication section is joined, is provided with circular solder resist whose diameter is smaller than an inner diameter of the cylindrical external terminal communication section.

4. The power semiconductor device according to claim 1, wherein an external terminal having at least three projections contacting an inner wall of the cylindrical external terminal communication section, is inserted into the cylindrical external terminal communication section.

5. The power semiconductor device according to claim 1, wherein the cylindrical external terminal communication section is provided with a pad on which wire bonding is performable.

6. The power semiconductor device according to claim 1, wherein the cylindrical external terminal communication section is provided with a bus bar terminal that is used as the circuit forming means.

7. The power semiconductor device according to claim 1, wherein a taper is formed at an upper end of the cylindrical external terminal communication section such that an outermost circumferential edge of the cylindrical external terminal communication section extends further from the wiring pattern into the transfer molding resin than an inner circumferential edge extends from the wiring pattern into the transfer molding resin.

* * * * *